United States Patent
Lee et al.

(10) Patent No.: US 10,970,044 B2
(45) Date of Patent: Apr. 6, 2021

(54) SEMICONDUCTOR DEVICE FOR PERFORMING SUM-OF-PRODUCT COMPUTATION AND OPERATING METHOD THEREOF

(71) Applicant: MACRONIX INTERNATIONAL CO., LTD., Hsinchu (TW)

(72) Inventors: Ming-Hsiu Lee, Hsinchu (TW); Chao-Hung Wang, Tainan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 216 days.

(21) Appl. No.: 16/407,343

(22) Filed: May 9, 2019

(65) Prior Publication Data

US 2020/0133635 A1    Apr. 30, 2020

Related U.S. Application Data

(60) Provisional application No. 62/750,238, filed on Oct. 24, 2018.

(51) Int. Cl.
*G06F 7/544*    (2006.01)
*G11C 13/00*    (2006.01)

(52) U.S. Cl.
CPC .......... *G06F 7/5443* (2013.01); *G11C 13/003* (2013.01); *G11C 13/004* (2013.01); *G11C 2213/15* (2013.01); *G11C 2213/79* (2013.01)

(58) Field of Classification Search
CPC ... G06F 7/5443; G11C 13/003; G11C 13/004; G11C 2213/15; G11C 2213/79;

(Continued)

(56) References Cited

U.S. PATENT DOCUMENTS 8,885,422 B2    11/2014    Ribeiro et al.
9,747,980 B2    8/2017    Lee et al.
(Continued)

FOREIGN PATENT DOCUMENTS

CN    108665061 A    10/2018
TW    201113986 A    4/2011
(Continued)

OTHER PUBLICATIONS

TW Office Action dated Aug. 7, 2020 in Taiwan application (No. 108116044).

(Continued)

*Primary Examiner* — Tan V Mai
(74) *Attorney, Agent, or Firm* — McClure, Qualey & Rodack, LLP

(57) ABSTRACT

A semiconductor device for performing a sum-of-product computation and an operating method thereof are provided. The semiconductor device includes an inputting circuit, a scaling circuit, a computing memory and an outputting circuit. The inputting circuit is used for receiving a plurality of inputting signals. The inputting signals are voltages or currents. The scaling circuit is connected to the inputting circuit for transforming the inputting signals to be a plurality of compensated signals respectively. The compensated signals are voltages or currents. The computing memory is connected to the scaling circuit. The computing memory includes a plurality of computing cells and the compensated signals are applied to the computing cells respectively. The outputting circuit is connected to the computing memory for reading an outputting signals of the computing cells. The outputting signal is voltage or current.

20 Claims, 16 Drawing Sheets

(58) Field of Classification Search
CPC ... G11C 7/04; G11C 13/0028; G11C 16/0425; G11C 16/24; G11C 7/1006; G11C 11/54; G11C 16/26
USPC .......................................................... 708/603
See application file for complete search history.

(56) References Cited

U.S. PATENT DOCUMENTS

| | | | |
|---|---|---|---|
| 10,037,804 B1* | 7/2018 | Buchanan | G11C 13/0069 |
| 10,325,655 B2 | 6/2019 | Ge et al. | |
| 10,419,346 B1* | 9/2019 | Strachan | G09C 1/00 |
| 2011/0080775 A1 | 4/2011 | Bae et al. | |
| 2012/0230103 A1 | 9/2012 | Choe et al. | |
| 2015/0049536 A1 | 2/2015 | Oh et al. | |
| 2017/0206954 A1 | 7/2017 | Lee et al. | |
| 2018/0330236 A1 | 11/2018 | Hou et al. | |
| 2019/0019564 A1* | 1/2019 | Li | H01L 29/7923 |

FOREIGN PATENT DOCUMENTS

| | | |
|---|---|---|
| TW | 201703032 A | 1/2017 |
| TW | 201727628 A | 8/2017 |
| TW | I625681 B | 6/2018 |
| WO | 2017105517 A1 | 6/2017 |

OTHER PUBLICATIONS

Lin, et al.: "A Novel Varying-bias Read Scheme for MLC and Wide Temperature Range TMO ReRAM"; EDL-2016-08-1397; pp. 1-4.
TW Office Action dated Jan. 11, 2021 in Taiwan application (No. 108116044).
English translation of TW Office Action dated Jan. 11, 2021 in Taiwan application (No. 108116044).

* cited by examiner

SEMICONDUCTOR DEVICE FOR PERFORMING SUM-OF-PRODUCT COMPUTATION AND OPERATING METHOD THEREOF

This application claims the benefit of U.S. provisional application Ser. No. 62/750,238, filed Oct. 24, 2018, the subject matter of which is incorporated herein by reference.

TECHNICAL FIELD

The disclosure relates in general to a semiconductor device and an operating method thereof, and more particularly to a semiconductor device for performing a sum-of-product computation and an operating method thereof.

BACKGROUND

Along with the semiconductor technology, several semiconductor devices are invented. A novel semiconductor device is used for computation, such as "sum-of-product." "sum-of-product" is useful for Artificial Intelligence technology.

However, the conductance and resistance of the semiconductor device may not be stable. The conductance and resistance may be affected by several factors. As a result, the final computation result may be changed and caused error.

SUMMARY

The disclosure is directed to a semiconductor device for performing a sum-of-product computation and an operating method thereof. By transforming the inputting signals, the final computation result can be compensated, even if the semiconductor device is affected by several factors.

According to one embodiment, a semiconductor device for performing a sum-of-product computation. The semiconductor device includes an inputting circuit, a scaling circuit, a computing memory and an outputting circuit. The inputting circuit is used for receiving a plurality of inputting signals. The inputting signals are voltages or currents. The scaling circuit is connected to the inputting circuit for transforming the inputting signals to be a plurality of compensated signals respectively. The compensated signals are voltages or currents. The computing memory is connected to the scaling circuit. The computing memory includes a plurality of computing cells and the compensated signals are applied to the computing cells respectively. The outputting circuit is connected to the computing memory for reading an outputting signal of the computing cells. The outputting signal is voltage or current.

According to another embodiment, an operating method of a semiconductor device for performing a sum-of-product computation. The operating method of the semiconductor device includes the following steps. A plurality of inputting signals are received. The inputting signals are voltages or currents. The inputting signals are transformed to be a plurality of compensated signals respectively. The compensated signals are voltages or currents. The compensated signals are applied to a plurality of computing cells of a computing memory of the semiconductor device. An outputting signal of the computing cells is read. The outputting signal is voltage or current.

Figure 1:
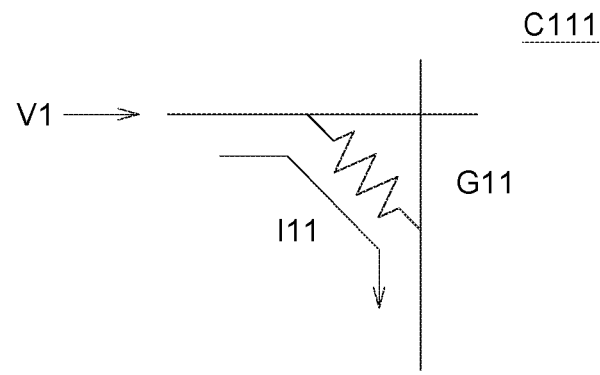
FIG. 1 shows a computing cell according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a computing cell C111 according to one embodiment is shown. The computing cell C111 includes a cross-point resistor having a weight G11 which is a conductance. An inputting voltage V1 is applied to the computing cell C111 and a current I11 of the computing cell C111 is read out. The current I11 represents the product of the inputting voltage V1 and the weight G11, i.e. I11=V1*G11.

Figure 2:
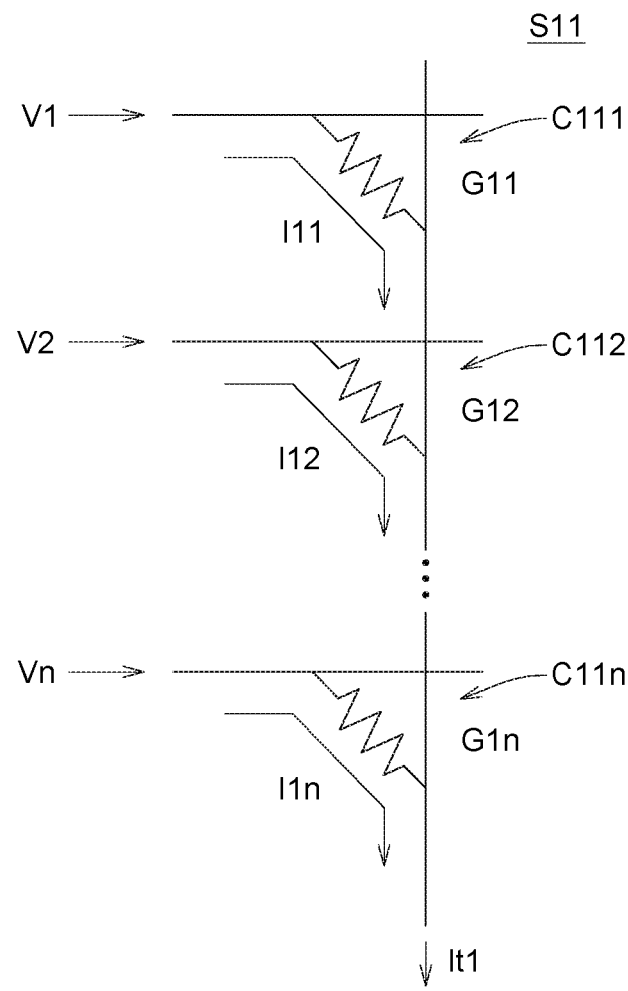
FIG. 2 shows a computing cell string according to one embodiment.

Referring to FIG. 2, a computing cell string S11 according to one embodiment is shown. The computing cell string S11 includes a plurality computing cells C111, C112, ..., C11$n$ connected in series. The computing cell C111 includes the cross-point resistor having the weight G11. The computing cell C112 includes a cross-point resistor having the weight G12. The computing cell C11$n$ includes a cross-point resistor having the weight G1$n$. A plurality of inputting voltages V1, V2, ..., Vn are applied to the computing cells C111, C112, ..., C11$n$ and an outputting current It1, integrating a plurality currents I11, I12, ..., I1n of the computing cells C111, C112, ..., C11n, is read out. The outputting current It1 represents the sum-of-product of the inputting voltages V1, V2, ..., Vn and the weights G11, G12, ..., G1n, i.e. It1=I11+I12+ ... +I1n=V1*G11+V2*G12+ ... +Vn*G1n.

Figure 3:
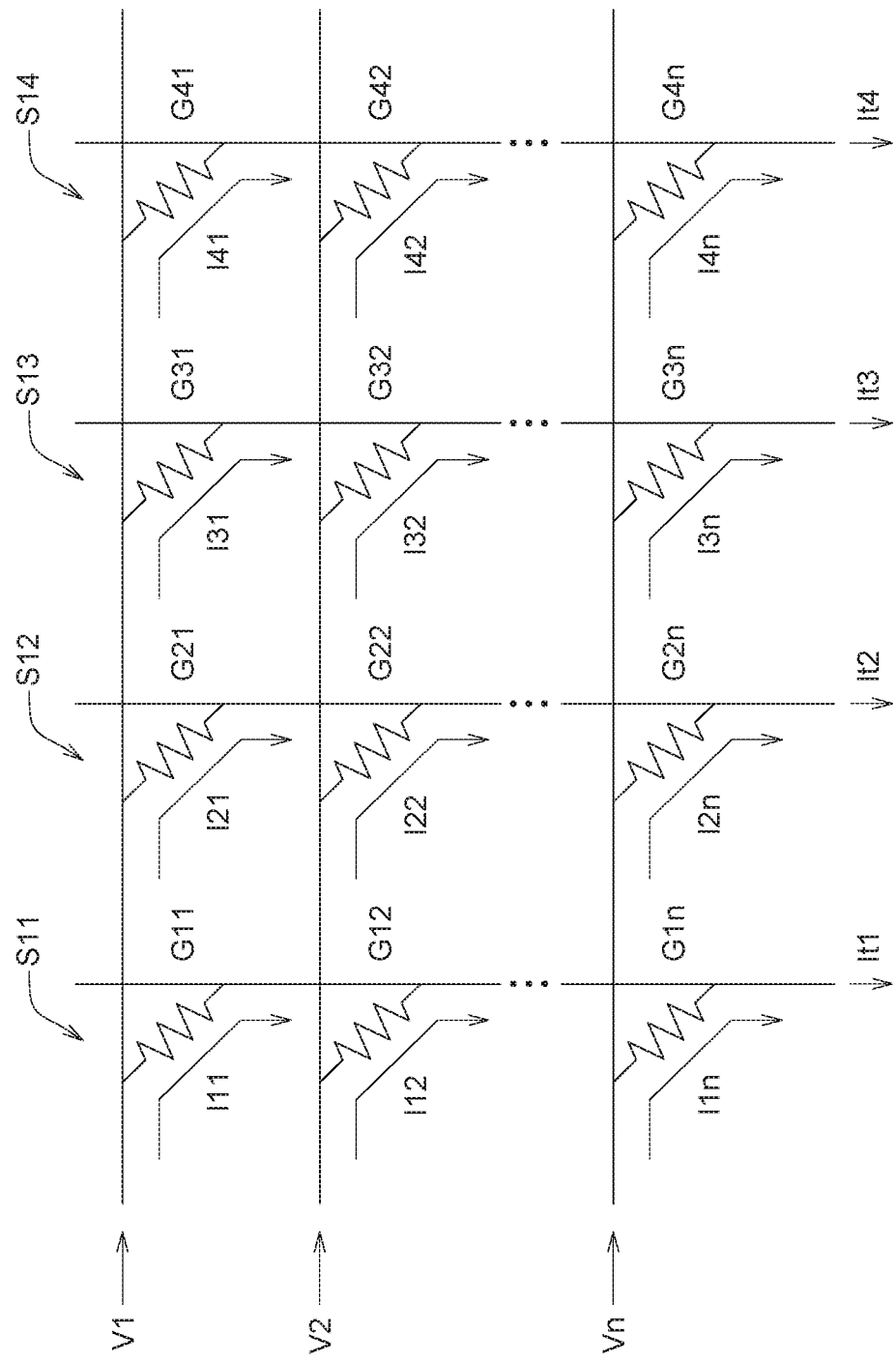
FIG. 3 shows a computing memory according to one embodiment.

Referring to FIG. 3, a computing memory M13 according to one embodiment is shown. The computing memory M13 includes a plurality of computing cell strings S11, S12, S13, S14. A plurality inputting voltages V1, V2, ..., Vn are applied to the computing cell strings S11, S12, S13, S14 and a plurality of outputting currents It1, It2, It3, It4 are read out. The outputting current It1 represents the sum-of-product of the inputting voltages V1, V2, ..., Vn and weights G11, G12, ..., G1n, i.e. It1=I11+I12+ ... +I1n=V1*G11+V2*G12+ ... +Vn*G1n. The outputting current It2 represents the sum-of-product of the inputting voltages V1, V2, ..., Vn and weights G21, G22, ..., G2n, i.e. It2=I21+I22+ ... +I2n=V1*G21+V2*G22+ ... +Vn*G2n. The outputting current It3 represents the sum-of-product of the inputting voltages V1, V2, ..., Vn and weights G31, G32, ..., G3n, i.e. It3=I31+I32+ ... +I3n=V1*G31+V2*G32+ ... +Vn*G3n. The outputting current It4 represents the sum-of-product of the inputting voltages V1, V2, ..., Vn and weights G41, G42, ..., G4n, i.e. It4=I41+I42+ ... +I4n=V1*G41+V2*G42+ ... +Vn*G4n.

Figure 4:
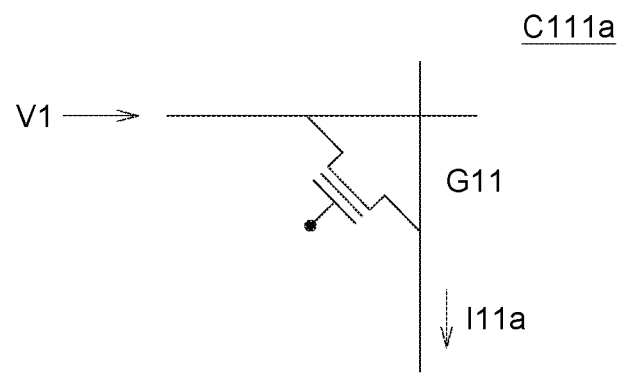
FIG. 4 shows a computing cell including a floating gate transistor according to one embodiment.
Figure 5:
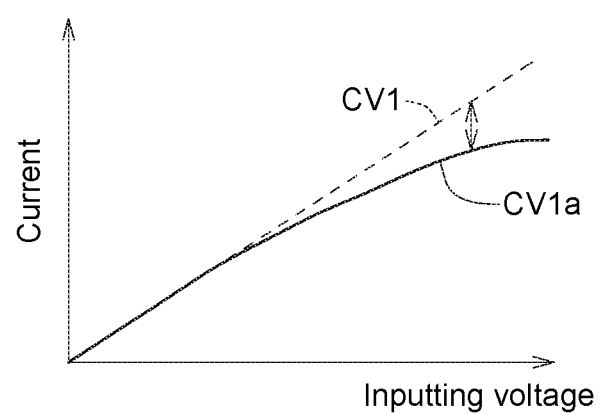
FIG. 5 shows an ideal relationship curve and a real relationship curve of the current and the inputting voltage.

Please refer to FIG. 4 and FIG. 5. FIG. 4 shows a computing cell C111a including a floating gate transistor according to one embodiment. FIG. 5 shows an ideal relationship curve CV1 and a real relationship curve CV1a of the current and the inputting voltage. The slope of the ideal relationship curve CV1 is the weight G11. That is to say, the ideal relationship curve CV1 is the equation "I11=V1*G11." However, in case of the floating gate transistor, the threshold voltage is used as the weight G11 and the drain bias is used as the inputting voltage V1. Current I11a of the computing cell C111a may be rolled off when the inputting voltage V1 is large.

Figure 6:
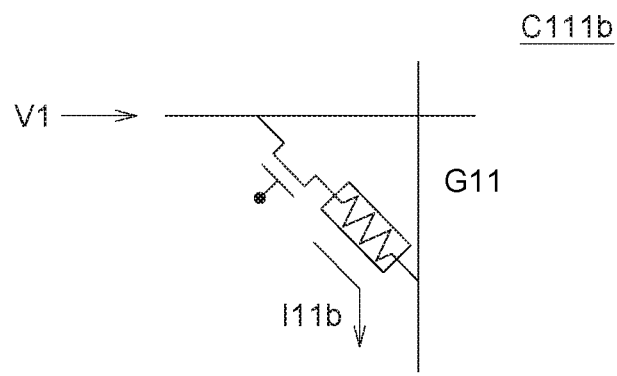
FIG. 6 shows a computing cell including a resistive memory (ReRAM) cell.
Figure 7:
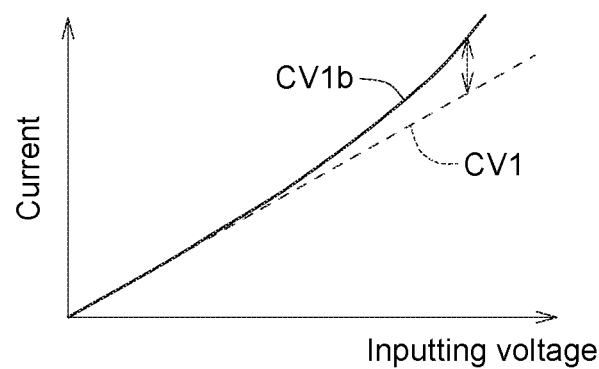
FIG. 7 shows the ideal relationship curve and a real relationship curve of the current and the inputting voltage.

Please refer to FIG. 6 and FIG. 7. FIG. 6 shows a computing cell C111b including a resistive memory (ReRAM) cell. FIG. 7 shows the ideal relationship curve CV1 and a real relationship curve CV1b of the current and the inputting voltage. In case of the ReRAM cell, the conductance is used as the weight G11 and the bit line bias is used as the inputting voltage V1. Current I11b of the computing cell C111b may be pitched up when the inputting voltage V1 is large.

Figure 8:
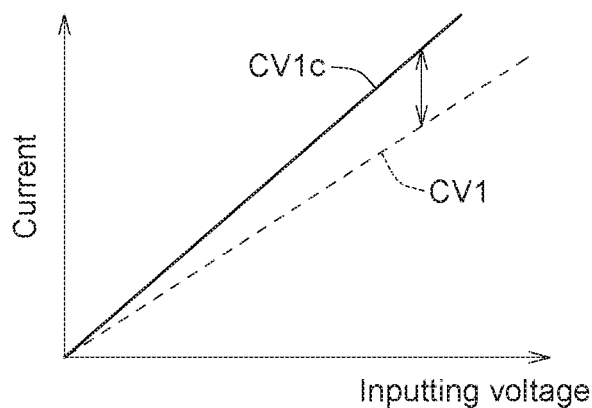
FIG. 8 shows the ideal relationship curve and another real relationship curve of the current and the inputting voltage.

Moreover, other parameters may also affect the computation result. Please refer to FIG. 8, which shows the ideal relationship curve CV1 and another real relationship curve CV1c of the current and the inputting voltage. In the real relationship curve CV1c, the slope may be changed when the temperature is changed. For example, the temperature issue may be happened on floating gate memory, metal oxide ReRAM memory, charge trapping memory, split-gate memory, FeRAM memory, or MRAM memory.

Figure 9:
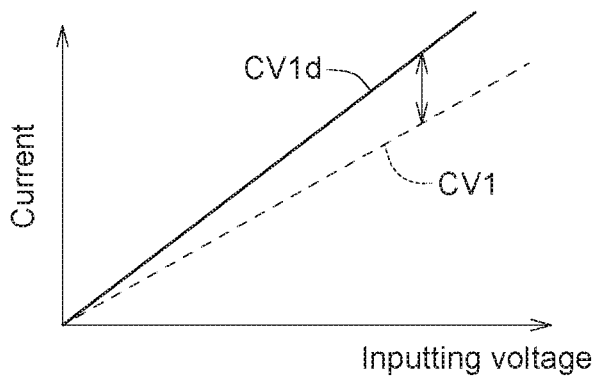
FIG. 9 shows the ideal relationship curve and another real relationship curve of the current and the inputting voltage.

Please refer to FIG. 9, which shows the ideal relationship curve CV1 and another real relationship curve CV1d of the current and the inputting voltage. In the real relationship curve CV1d, the slope may be changed when the retention time is increased. For example, the retention time issue may be happened on floating gate memory, metal oxide ReRAM memory, charge trapping memory, split-gate memory, FeRAM memory, or MRAM memory.

Base on above, the final computation result may be changed and caused error due to the rolling off issue, the pitching up issue, the temperature issue or the retention time issue.

Figure 10:
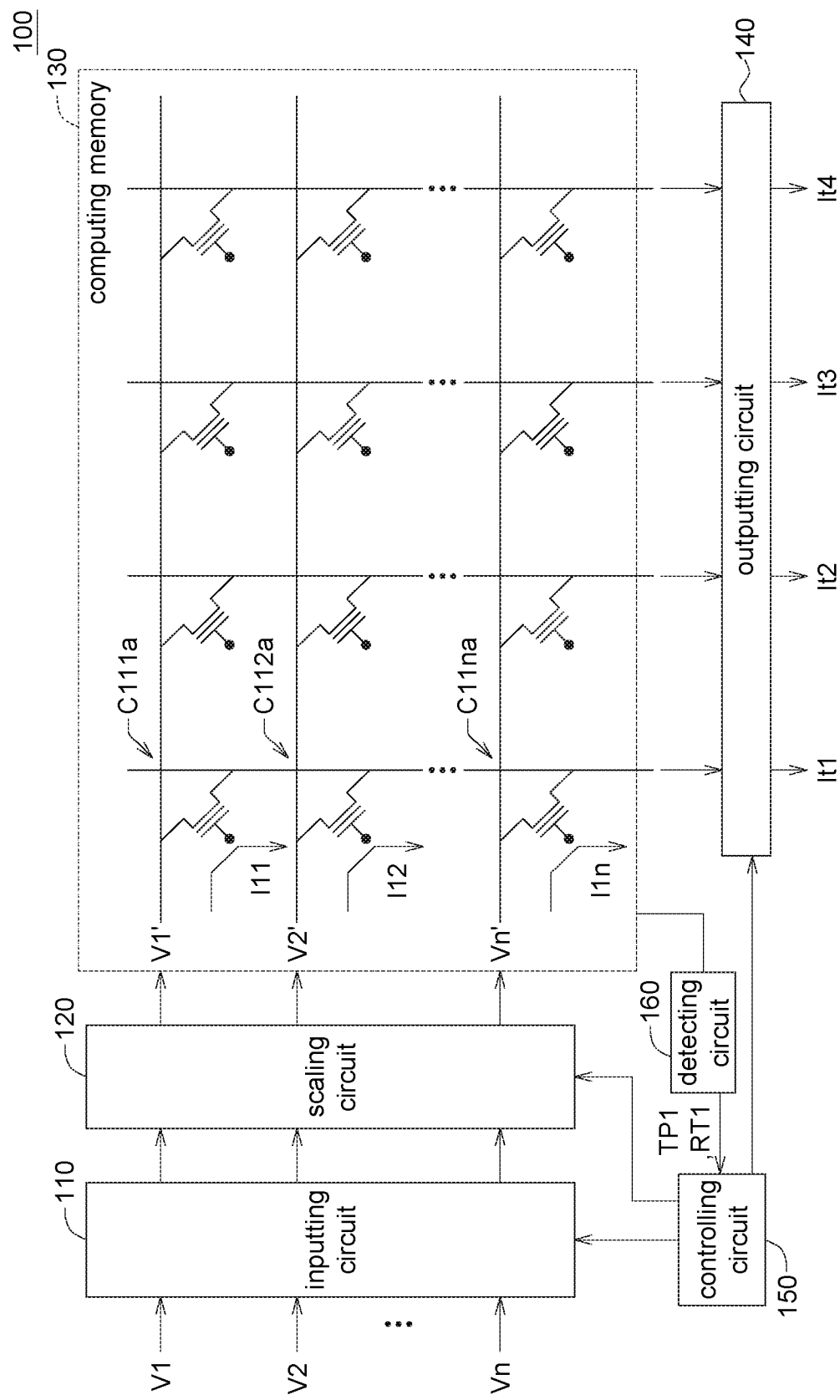
FIG. 10 shows a semiconductor device according to one embodiment.

Please refer to FIG. 10, which shows a semiconductor device 100 according to one embodiment. The semiconductor device 100 includes an inputting circuit 110, a scaling circuit 120, a computing memory 130, an outputting circuit 140, a controlling circuit 150 and a detecting circuit 160. The semiconductor device 100 is used for performing the sum-of-product computation. In the semiconductor device 100, the scaling circuit 120 is used to compensate the computation, such that the computation result is kept accurate even if the rolling off issue, the pitching up issue, the temperature issue or the retention time issue happens. The operation of those elements is illustrated with a flowchart.

Figure 11:
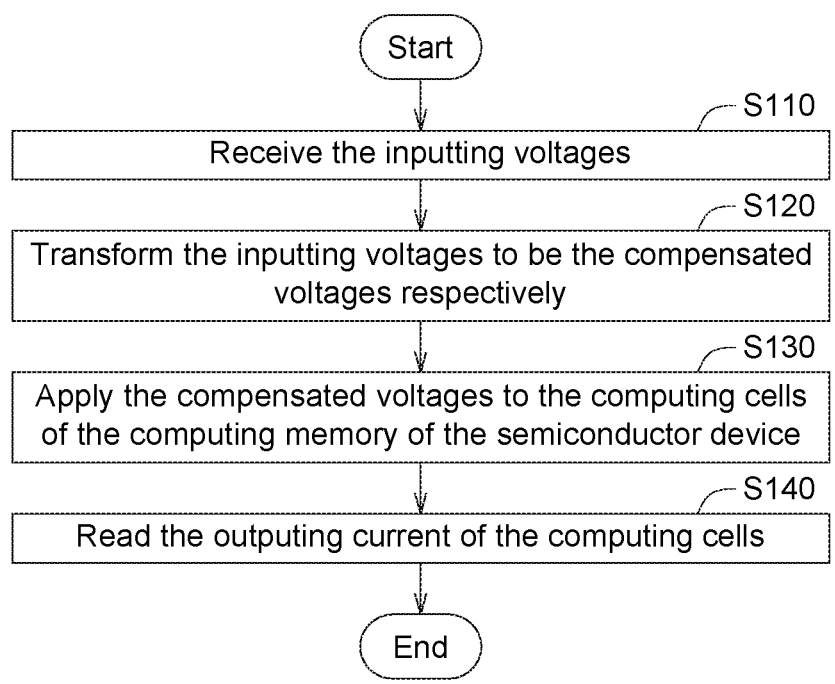
FIG. 11 shows a flowchart of an operating method of the semiconductor device according to one embodiment.

Please referring to FIGS. 10 and 11, FIG. 11 shows a flowchart of an operating method of the semiconductor device 100 according to one embodiment. In step S110, the inputting circuit 110 receives the inputting voltages V1, V2, ..., Vn.

Figure 12:
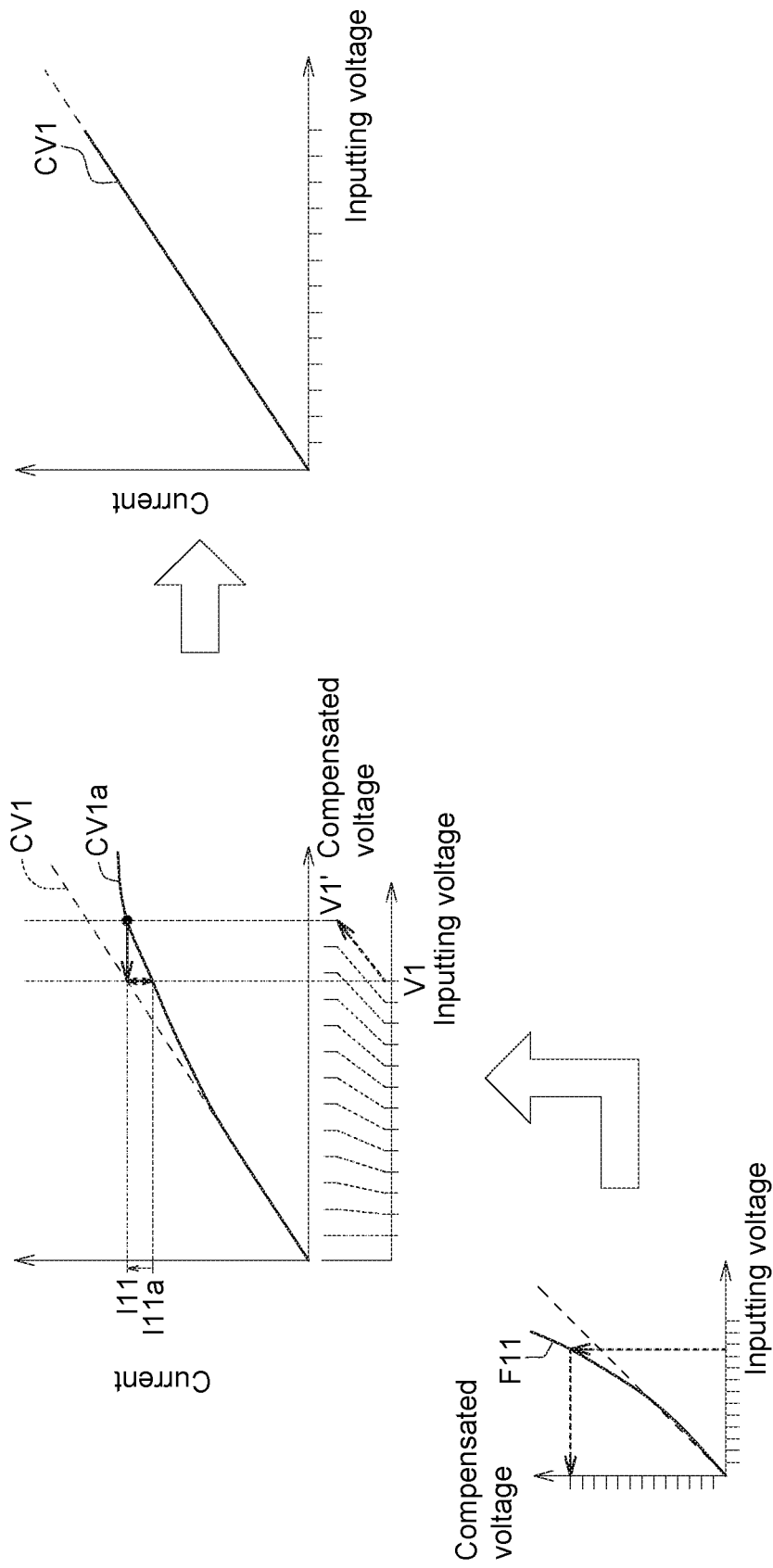
FIG. 12 illustrates the step S120 according to one embodiment.

In step S120, the scaling circuit 120 transforms the inputting voltages V1, V2, ..., Vn to be a plurality of compensated voltages V1', V2', ..., Vn' respectively. Please refer to FIG. 12, which illustrates the step S120 according to one embodiment. The scaling circuit 120 may transform the inputting voltages V1, V2, ..., Vn according to a non-linear function F11. In one embodiment, the scaling circuit 120 may transform the inputting voltages V1, V2, ..., Vn according to different non-linear functions respectively. The non-linear function F11 is an exponential function, a threshold function or a combination thereof. For example, the inputting voltage V1 is shifted to be the compensated voltage V1' which is larger than the inputting voltage V1. According to the real relationship curve CV1a, the current I11a is shifted to the current I11. Therefore, the accurate current can be obtained even if the rolling off issue is happened.

In step S130, the compensated voltages V1', V2', ..., Vn' are applied to the computing cells C111a, C112a, ..., C11na respectively.

In step S140, the outputting circuit 140 reads the outputting current It1 of the computing cells C111a, C112a, ..., C11na. Because each of the currents I11, I12, ..., I1n is accurate, the outputting current It1 integrating the currents I11, I12, ..., I1n is also accurate. Therefore, the sum-of-product is accurate even if the rolling off issue is happened.

Figure 13:
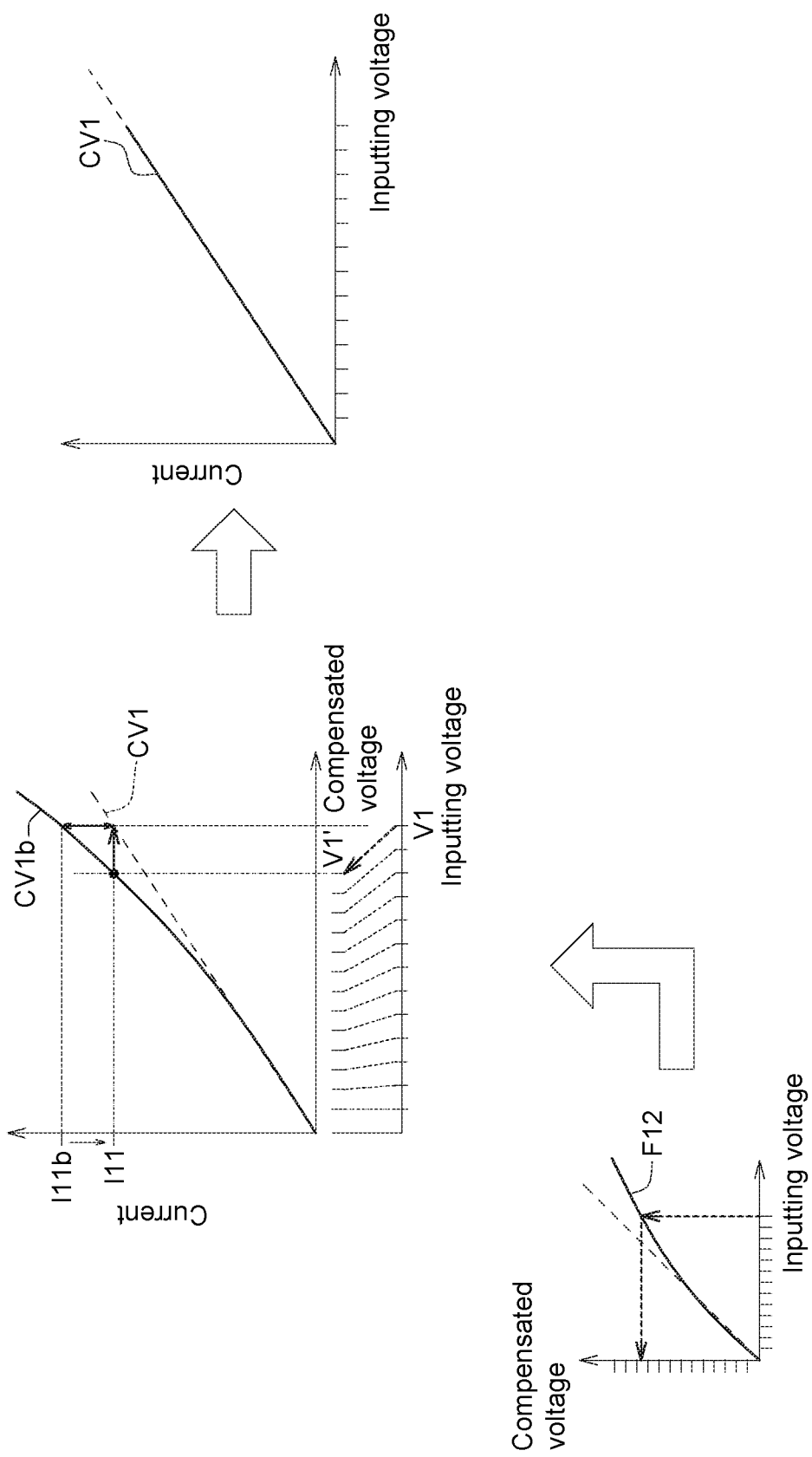
FIG. 13 illustrates the step S120 according to another embodiment.

Please refer to FIG. 13, which illustrates the step S120 according to another embodiment. In case of pitching up issue, the scaling circuit 120 may transform the inputting voltages V1, V2, ..., Vn according to another non-linear function F12. The non-linear function F12 is an exponential function, a threshold function or a combination thereof. For example, the inputting voltage V1 is shifted to be the compensated voltage V1' which is less than the inputting voltage V1. According to the real relationship curve CV1b, the current I11b is shifted to the current I11. Therefore, the accurate current can be obtained even if the pitching up issue is happened.

Figure 14:
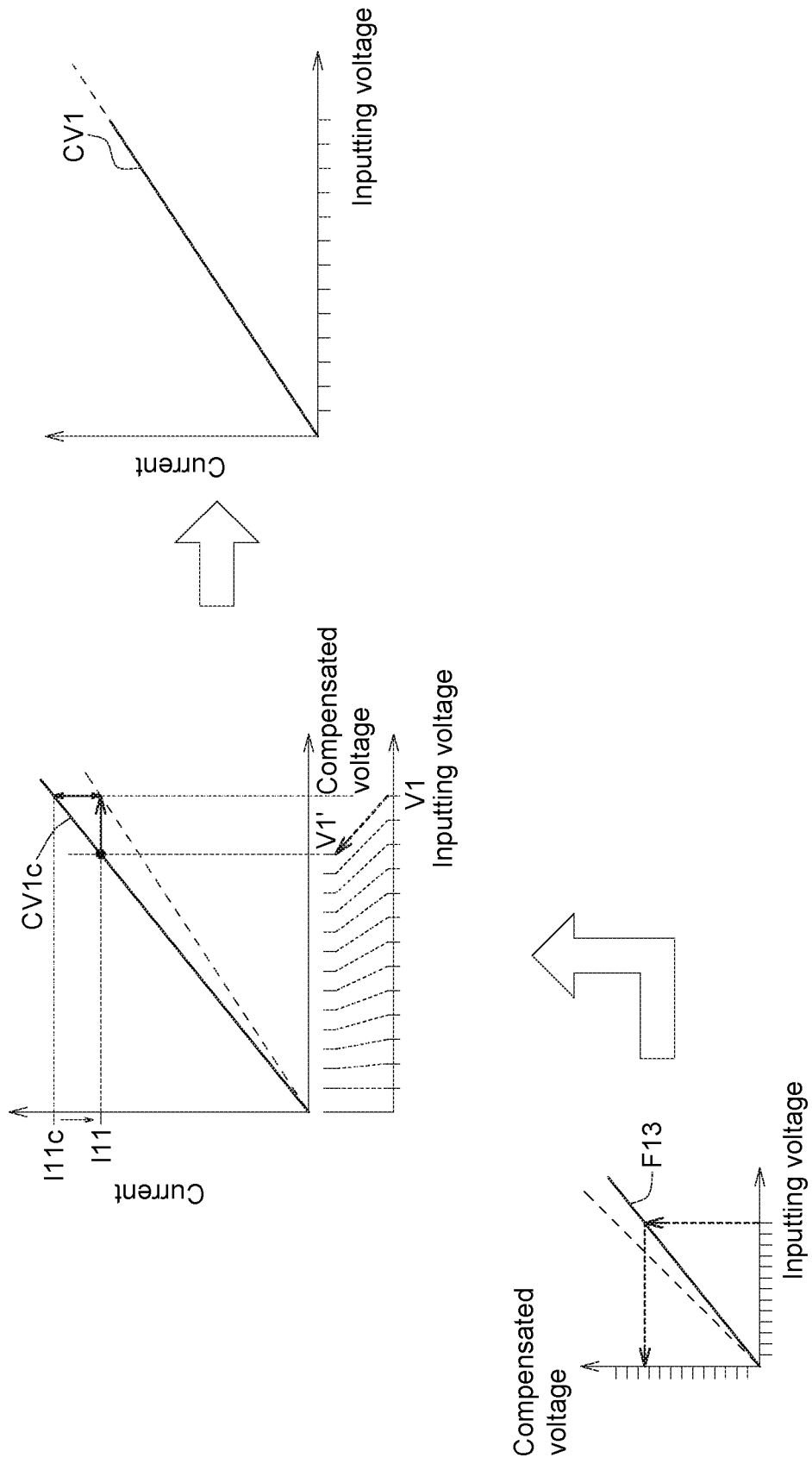
FIG. 14 illustrates the step S120 according to another embodiment.

Please refer to FIG. 14, which illustrates the step S120 according to another embodiment. In case of the temperature issue or the retention time issue, the scaling circuit 120 may transform the inputting voltages V1, V2, ..., Vn according to a linear function F13. For example, the inputting voltage V1 is shifted to be the compensated voltage V1' which is less than the inputting voltage V1. According to the real relationship curve CV1c, current I11c is shifted to the current I11. Therefore, the accurate current can be obtained even if the temperature issue or the retention time issue is happened. In case of temperature issue or the retention time issue, the step S120 of transforming the inputting voltages V1, V2, . . . , Vn according to the linear function F13 can be applied on the floating gate memory, the metal oxide ReRAM memory, the charge trapping memory, the split-gate memory, the FeRAM memory, or the MRAM memory, etc.

Referring to FIG. 10, in one embodiment, the compensation can be controlled by the controlling circuit 150. The detecting circuit 160 detects the temperature TP1 of the computing memory 130, and then transmits the temperature TP1 to the controlling circuit 150. The controlling circuit 150 modifies at least one parameter of the scaling circuit 120, such that the scaling circuit 120 transforms the inputting voltages V1, V2, . . . , Vn according to the temperature TP1 of the computing memory 130.

In another embodiment, the detecting circuit 160 stores retention time RT1 of the computing memory 130, and then transmits the retention time RT1 to the controlling circuit 150. The controlling circuit 150 modifies at least one parameter of the scaling circuit 120, such that the scaling circuit 120 transforms the inputting voltages V1, V2, . . . , Vn according to the retention time RT1 of the computing memory 130.

In one embodiment, the controlling circuit 150 may enable or disable the scaling circuit 120 according to a condition. For example, if the temperature TP1 is higher than a predetermined value, then the controlling circuit 150 enables the scaling circuit 120; if the temperature TP1 is not higher than the predetermined value, then the controlling circuit 150 disables the scaling circuit 120.

Figure 15:
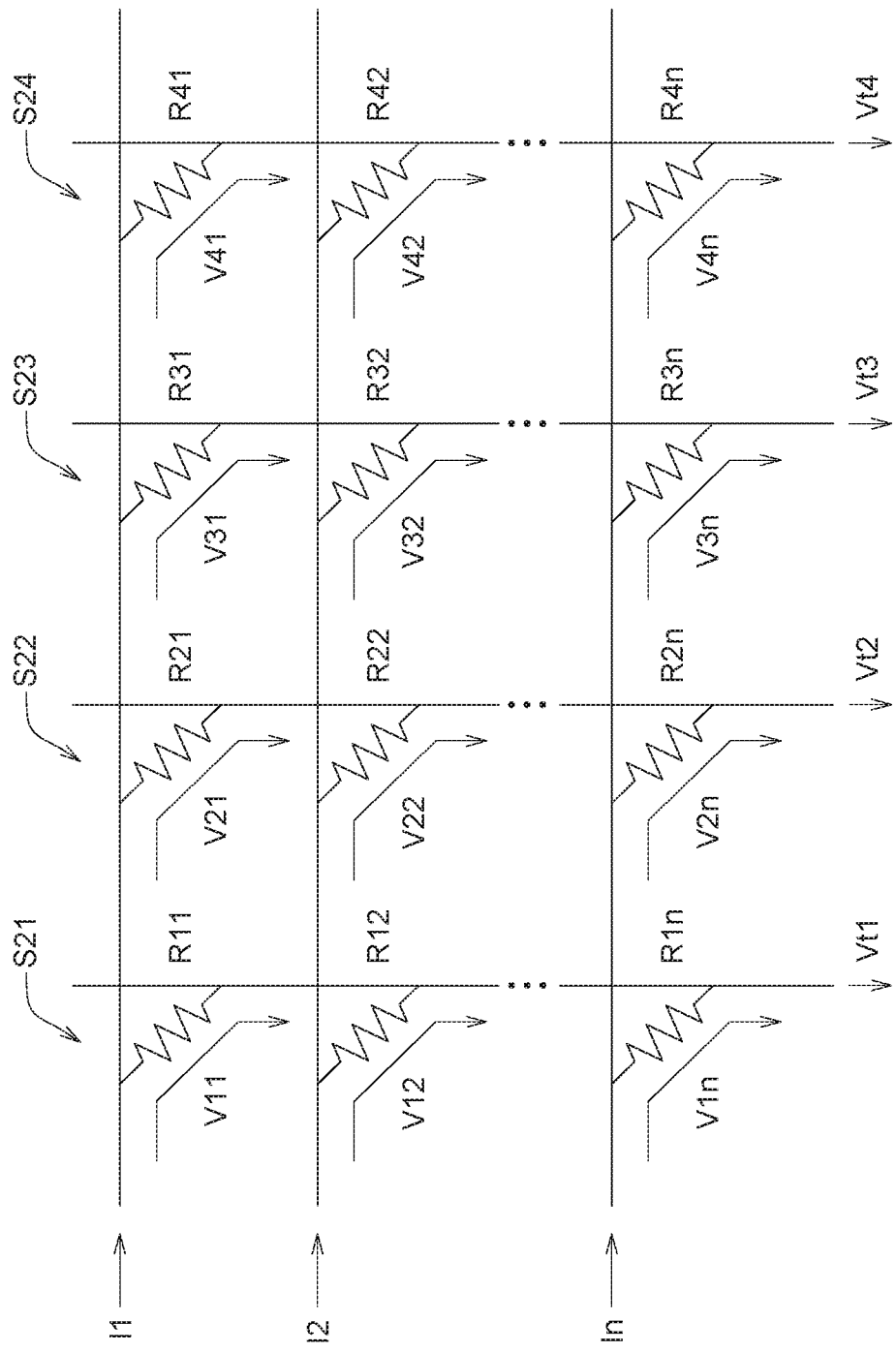
FIG. 15 shows a computing memory according to another embodiment.

Referring to FIG. 15, a computing memory M23 according to another embodiment is shown. The computing memory M23 includes a plurality of computing cell strings S21, S22, S23, S24. A plurality inputting currents I1, I2, . . . , In are applied to the computing cell strings S21, S22, S23, S24 and a plurality of outputting voltages Vt1, Vt2, Vt3, Vt4 are read out. The outputting voltage Vt1 represents the sum-of-product of the inputting currents I1, I2, . . . , In and weights R11, R12, . . . , R1n, each of which is a resistance, i.e. Vt1=V11+V12+ . . . +V1n=I1*R11+I2*R12+ . . . +In*R1n. The outputting voltage Vt2 represents the sum-of-product of the inputting currents I1, I2, . . . , In and weights R21, R22, . . . . R2n, i.e. Vt2=V21+V22+ . . . +V2n=I1*R21+I2*R22+ . . . +In*R2n. The outputting voltage Vt3 represents the sum-of-product of the inputting currents I1, I2, . . . , In and weights R31, R32, . . . , R3n, i.e. Vt3=V31+V32+ . . . +V3n=I1*R31+I2*R32+ . . . +In*R3n. The outputting voltage Vt4 represents the sum-of-product of the inputting currents I1, I2, . . . , In and weights R41, R42, . . . , R4n, i.e. Vt4=V41+V42+ . . . +V4n=I1*R41+I2*R42+ . . . +In*R4n.

Figure 16:
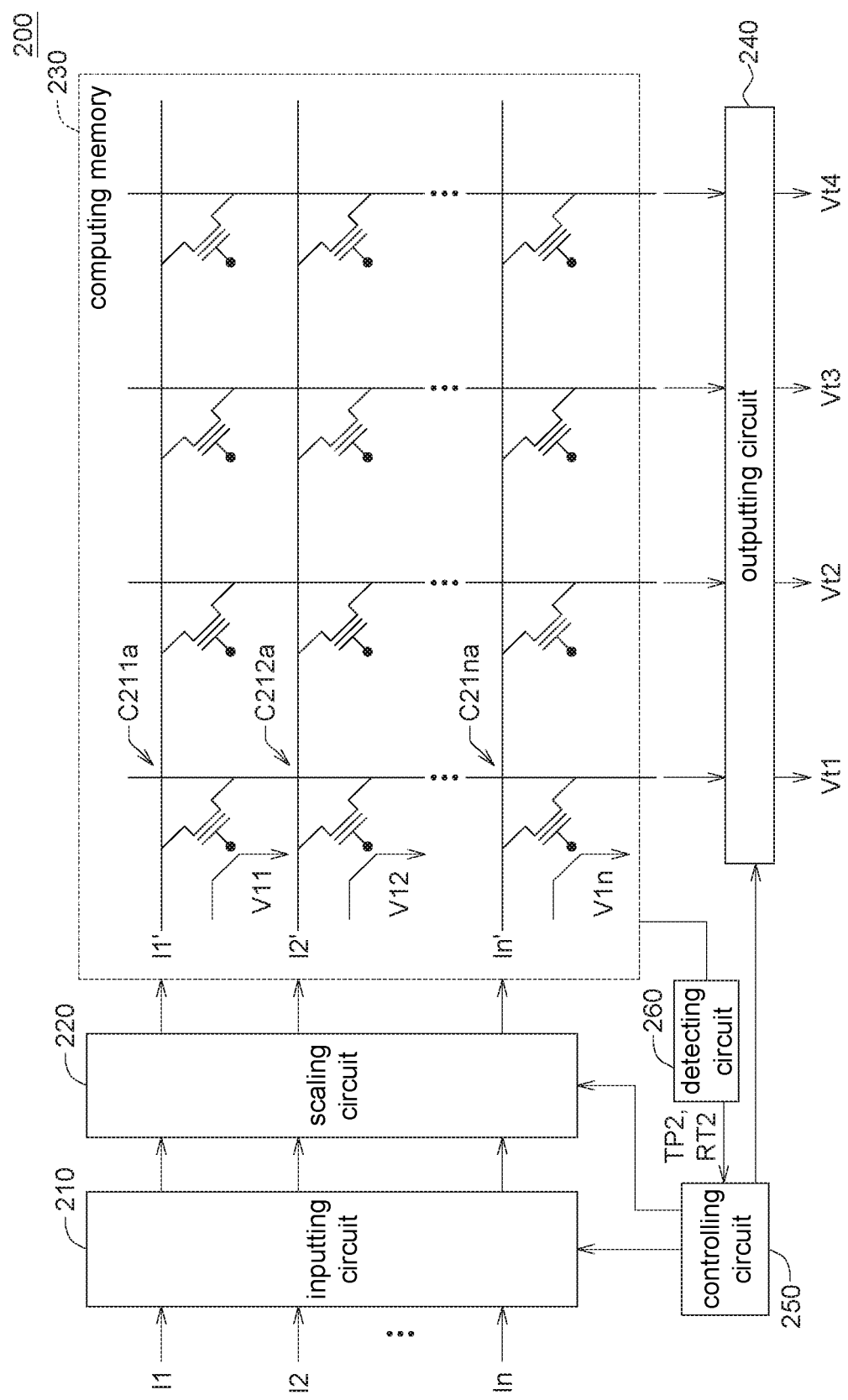
FIG. 16 shows a semiconductor device according to another embodiment.

Please refer to FIG. 16, which shows a semiconductor device 200 according to another embodiment. The semiconductor device 200 includes an inputting circuit 210, a scaling circuit 220, a computing memory 230, an outputting circuit 240, a controlling circuit 250 and a detecting circuit 260. The semiconductor device 200 is used for performing the sum-of-product computation. In the semiconductor device 200, the scaling circuit 220 is used to compensate the computation, such that the computation result is kept accurate even if the rolling off issue, the pitching up issue, the temperature issue or the retention time issue happens. The operation of those elements is illustrated with a flowchart.

Figure 17:
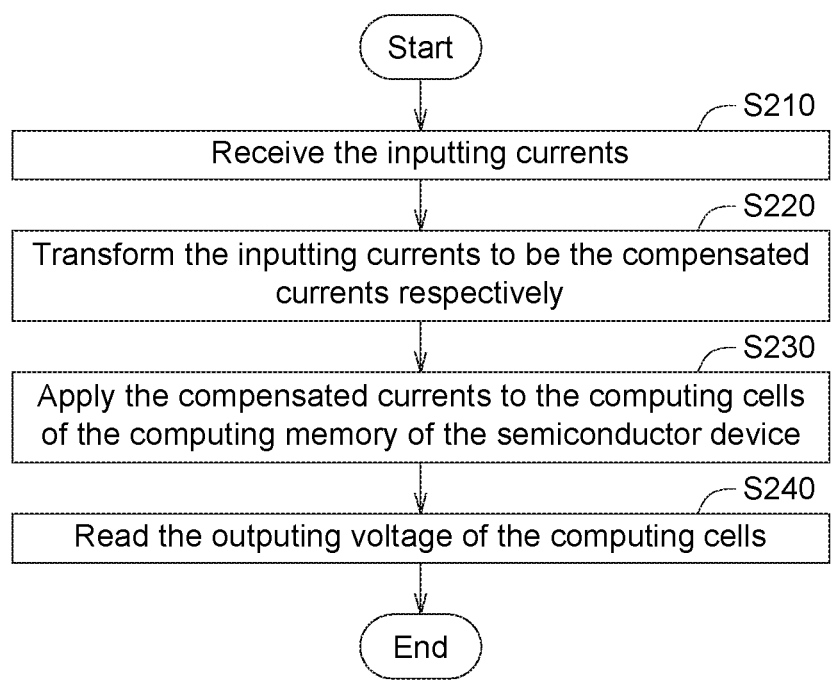
FIG. 17 shows a flowchart of an operating method of the semiconductor device according to another embodiment.

Please referring to FIGS. 16 and 17, FIG. 17 shows a flowchart of an operating method of the semiconductor device 200 according to another embodiment. In step S210, the inputting circuit 210 receives the inputting currents I1, I2, . . . , In.

Figure 18:
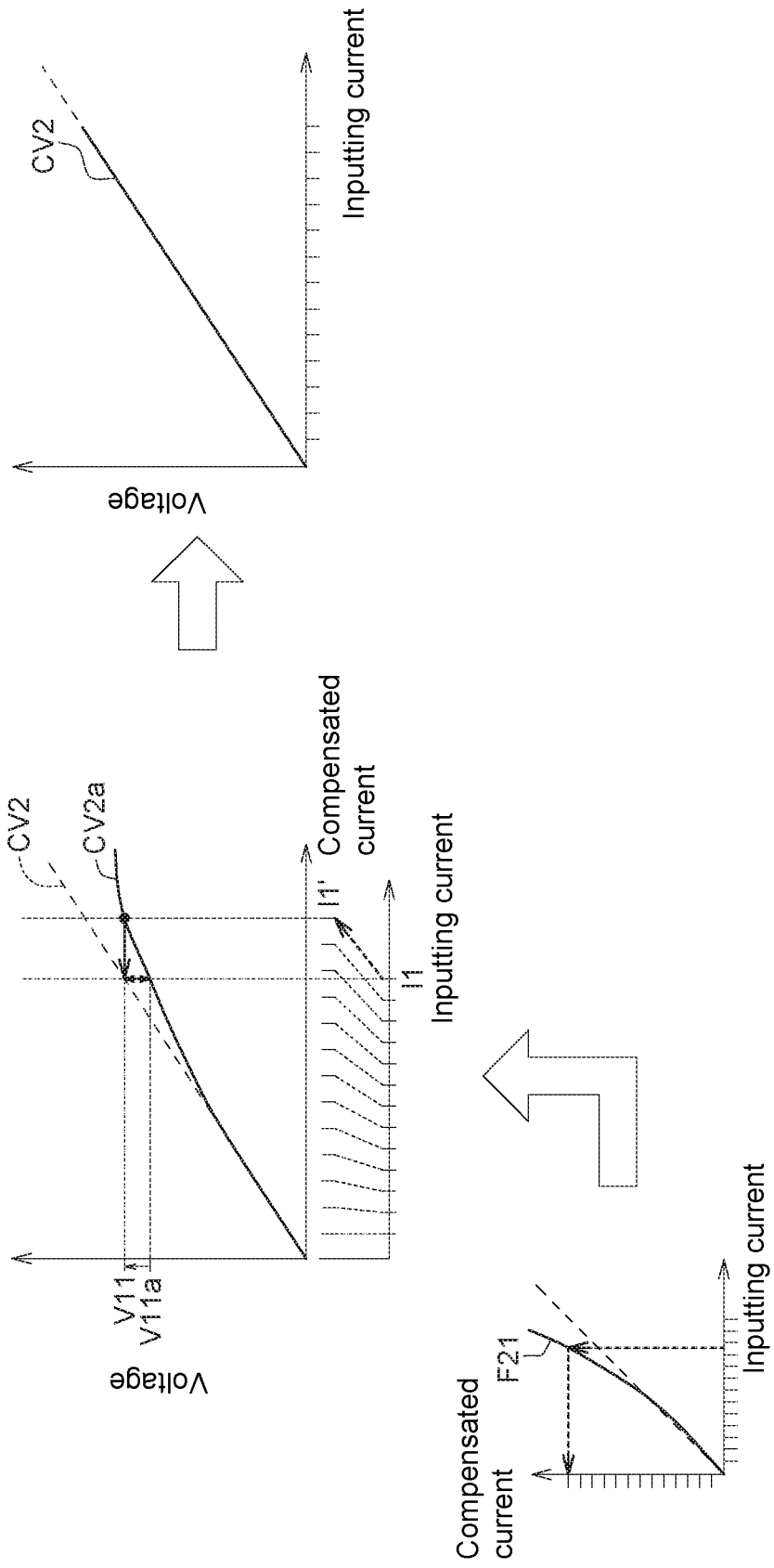
FIG. 18 illustrates the step S220 according to one embodiment.

In step S220, the scaling circuit 220 transforms the inputting currents I1, I2, . . . , In to be a plurality of compensated currents I1', I2', . . . , In' respectively. Please refer to FIG. 18, which illustrates the step S220 according to one embodiment. The scaling circuit 220 may transform the inputting currents I1, I2, . . . , In, according to a non-linear function F21. In one embodiment, the scaling circuit 220 may transform the inputting currents I1, I2, . . . , In, according to different non-linear functions respectively. The non-linear function F21 is an exponential function, a threshold function or a combination thereof. For example, the inputting current I1 is shifted to be the compensated current I1' which is larger than the inputting current I1. According to the real relationship curve CV2a, the voltage V11a is shifted to the voltage V11. Therefore, the accurate voltage can be obtained even if the rolling off issue is happened.

In step S230, the compensated currents I1', I2', . . . , In' are applied to the computing cells C211a, C212a, . . . , C21na respectively.

In step S240, the outputting circuit 240 reads the outputting voltage Vt1 of the computing cells C211a, C212a, . . . , C21na. Because each of the voltages V11, V12, . . . , V1n is accurate, the outputting voltage Vt1 integrating the voltages V11, V12, . . . , V1n is also accurate. Therefore, the sum-of-product is accurate even if the rolling off issue is happened.

Figure 19:
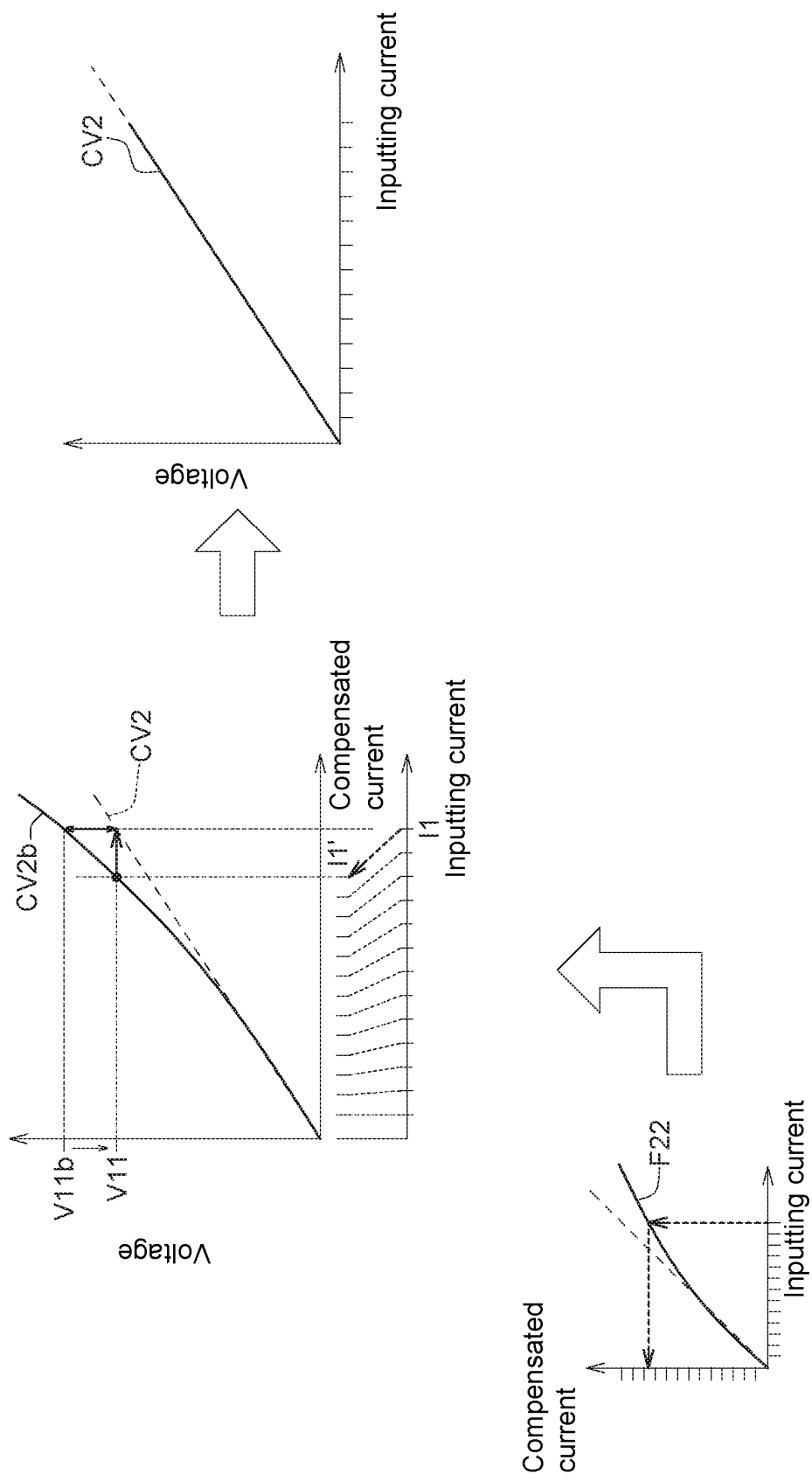
FIG. 19 illustrates the step S220 according to another embodiment.

Please refer to FIG. 19, which illustrates the step S220 according to another embodiment. In case of pitching up issue, the scaling circuit 220 may transform the inputting currents I1, I2, . . . , In, according to another non-linear function F22. The non-linear function F22 is an exponential function, a threshold function or a combination thereof. For example, the inputting current I1 is shifted to be the compensated current I1' which is less than the inputting current I1. According to the real relationship curve CV2b, the voltage V11b is shifted to the voltage V11. Therefore, the accurate voltage can be obtained even if the pitching up issue is happened.

Figure 20:
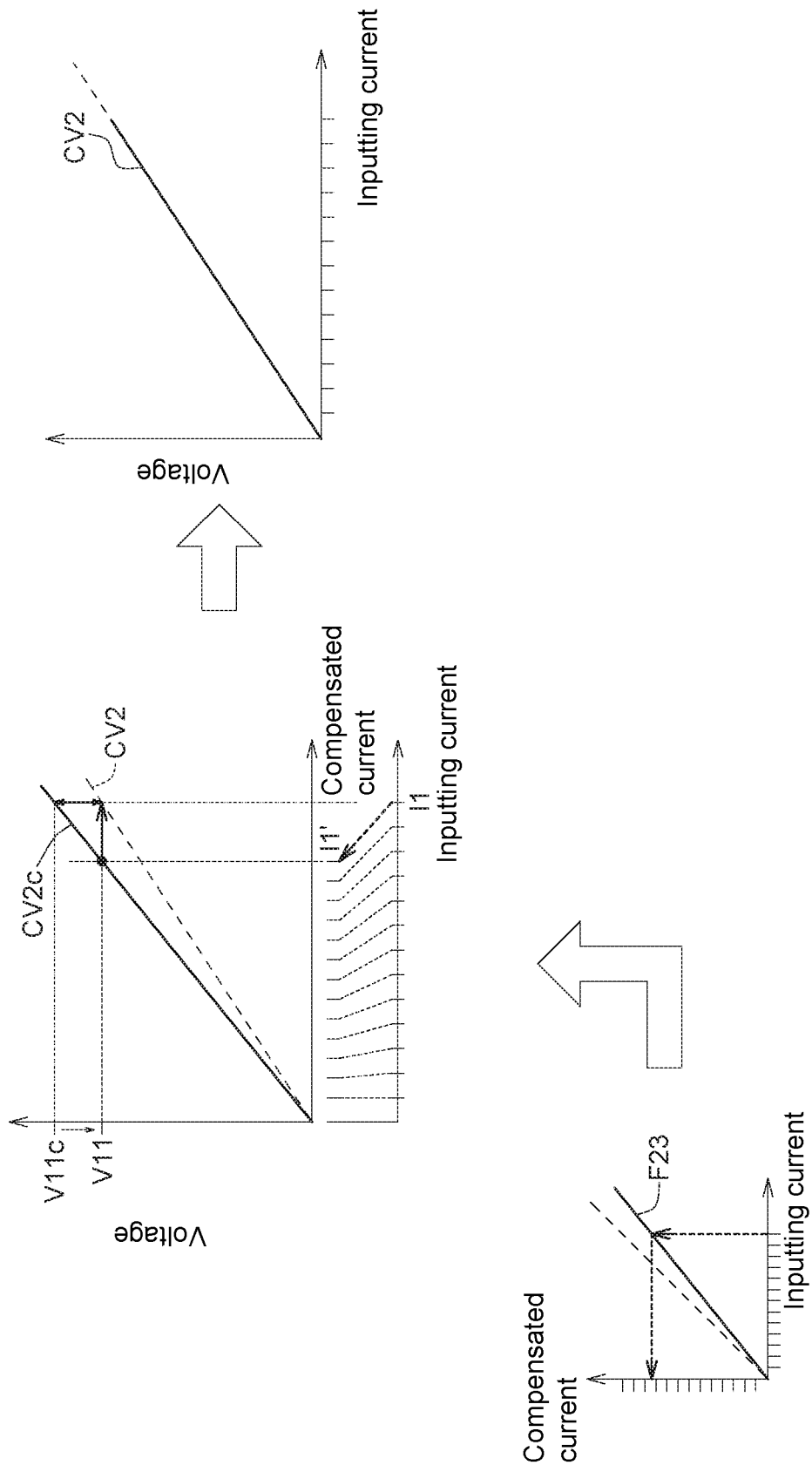
FIG. 20 illustrates the step S220 according to another embodiment.

Please refer to FIG. 20, which illustrates the step S220 according to another embodiment. In case of the temperature issue or the retention time issue, the scaling circuit 220 may transform the inputting currents I1, I2, . . . , In, according to a linear function F23. For example, the inputting current I1 is shifted to be the compensated current I1' which is less than the inputting current I1. According to the real relationship curve CV2c, voltage V11c is shifted to the voltage V11. Therefore, the accurate voltage can be obtained even if the temperature issue or the retention time issue is happened. In case of temperature issue or the retention time issue, the step S220 of transforming the inputting currents I1, I2, . . . , In, according to the linear function F23 can be applied on the floating gate memory, the metal oxide ReRAM memory, the charge trapping memory, the split-gate memory, the FeRAM memory, or the MRAM memory, etc.

Referring to FIG. 16, in one embodiment, the compensation can be controlled by the controlling circuit 250. The detecting circuit 260 may detect the temperature TP2 of the computing memory 230, and then transmits the temperature TP2 to the controlling circuit 250. The controlling circuit 250 modifies at least one parameter of the scaling circuit 220, such that the scaling circuit 220 transforms the inputting currents I1, I2, . . . , In, according to the temperature TP2 of the computing memory 230.

In another embodiment, the detecting circuit 260 may store retention time RT2 of the computing memory 230, and then transmits the retention time RT2 to the controlling circuit 250. The controlling circuit 250 modifies at least one parameter of the scaling circuit 220, such that the scaling circuit 220 transforms the inputting currents I1, I2, . . . , In, according to the retention time RT2 of the computing memory 230.

In one embodiment, the controlling circuit 250 may enable or disable the scaling circuit 220 according to a condition. For example, if the temperature TP2 is higher than a predetermined value, then the controlling circuit 250 enables the scaling circuit 220; if the temperature TP2 is not higher than the predetermined value, then the controlling circuit 150 disables the scaling circuit 220.

According to the embodiments described above, the final computation result can be compensated, even if the rolling off issue, the pitching up issue, the temperature issue or the retention time issue is happened.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor device for performing a sum-of-product computation, comprising:
    an inputting circuit, for receiving a plurality of inputting signals, wherein the inputting signals are voltages or currents;
    a scaling circuit, connected to the inputting circuit for transforming the inputting signals to be a plurality of compensated signals respectively, wherein the compensated signals are voltages or currents;
    a computing memory, connected to the scaling circuit, wherein the computing memory includes a plurality of computing cells and the compensated signals are applied to the computing cells respectively; and
    an outputting circuit, connected to the computing memory for reading an outputting signal of the computing cells, wherein the outputting signal is voltage or current.

2. The semiconductor device according to claim 1, wherein the scaling circuit transforms the inputting signals according to a non-linear function.

3. The semiconductor device according to claim 2, wherein the non-linear function is an exponential function, a threshold function or a combination thereof.

4. The semiconductor device according to claim 1, wherein the scaling circuit transforms the inputting signals according to a linear function.

5. The semiconductor device according to claim 1, wherein the scaling circuit transforms the inputting signals according to a temperature of the computing memory.

6. The semiconductor device according to claim 1, wherein the scaling circuit transforms the inputting signals according to a retention time of the computing memory.

7. The semiconductor device according to claim 1, wherein each value of the compensated signals is less than each value of the inputting signals.

8. The semiconductor device according to claim 1, wherein each value of the compensated signals is larger than each value of the inputting signals.

9. The semiconductor device according to claim 1, wherein the scaling circuit is enabled according to a condition.

10. The semiconductor device according to claim 1, further comprising:
    a controlling circuit for modifying at least one parameter of the scaling circuit.

11. An operating method of a semiconductor device for performing a sum-of-product computation, comprising:
    receiving a plurality of inputting signals, wherein the inputting signals are voltages or currents;
    transforming the inputting signals to be a plurality of compensated signals respectively, wherein the compensated signals are voltages or currents;
    applying the compensated signals to a plurality of computing cells of a computing memory of the semiconductor device; and
    reading an outputting signal of the computing cells, wherein the outputting signal is voltage or current.

12. The operating method of the semiconductor device according to claim 11, wherein the inputting signals are transformed according to a non-linear function.

13. The operating method of the semiconductor device according to claim 12, wherein the non-linear function is an exponential function, a threshold function or a combination thereof.

14. The operating method of the semiconductor device according to claim 11, wherein the inputting signals are transformed according to a linear function.

15. The operating method of the semiconductor device according to claim 11, wherein the inputting signals are transformed according to a temperature of the computing memory.

16. The operating method of the semiconductor device according to claim 11, wherein the inputting signals are transformed according to a retention time of the computing memory.

17. The operating method of the semiconductor device according to claim 11, wherein each of the compensated signals is less than each of the inputting signals.

18. The operating method of the semiconductor device according to claim 11, wherein each of the compensated signals is larger than each of the inputting signals.

19. The operating method of the semiconductor device according to claim 11, wherein the step of transforming the inputting signals is performed if a condition is satisfied.

20. The operating method of the semiconductor device according to claim 11, further comprising:
    modifying at least one parameter of the step of transforming the inputting signals.

* * * * *